(12) United States Patent
Tozun et al.

(10) Patent No.: US 7,898,261 B2
(45) Date of Patent: Mar. 1, 2011

(54) LAMP WITH METERING DEVICE

(75) Inventors: Nedjip Orhan Tozun, Monte Sereno, CA (US); Gabriel C. Risk, San Francisco, CA (US); Samuel W. Goldman, San Diego, CA (US); Xianyi Wu, Singapore (SG); Erica D. Estrada, Palo Alto, CA (US)

(73) Assignee: D.Light Design, Inc., Grand Cayman (KY)

( * ) Notice: Subject to any disclaimer, the term of this patent is extended or adjusted under 35 U.S.C. 154(b) by 422 days.

(21) Appl. No.: 12/122,752

(22) Filed: May 19, 2008

(65) Prior Publication Data

US 2009/0284261 A1    Nov. 19, 2009

(51) Int. Cl.
*G01R 31/00* (2006.01)
*G01R 11/63* (2006.01)
*G01R 11/32* (2006.01)

(52) U.S. Cl. .................. 324/414; 324/103 R; 324/142
(58) Field of Classification Search ................ 324/414, 324/103 R, 142
See application file for complete search history.

(56) References Cited

U.S. PATENT DOCUMENTS

| | | | | |
|---|---|---|---|---|
| 4,809,458 A | * | 3/1989 | Tanikuro et al. | 43/17.5 |
| 2009/0088991 A1 | * | 4/2009 | Brzezowski et al. | 702/62 |

* cited by examiner

*Primary Examiner*—Amy He
(74) *Attorney, Agent, or Firm*—Jones Day; Brett Lovejoy

(57) ABSTRACT

A lamp includes a generator that generates electricity. A battery stores the generated electricity. A light source produces light from the stored electricity. A metering device tallies an operating parameter indicative of the amount of electrical energy consumed by the lamp.

36 Claims, 1 Drawing Sheet

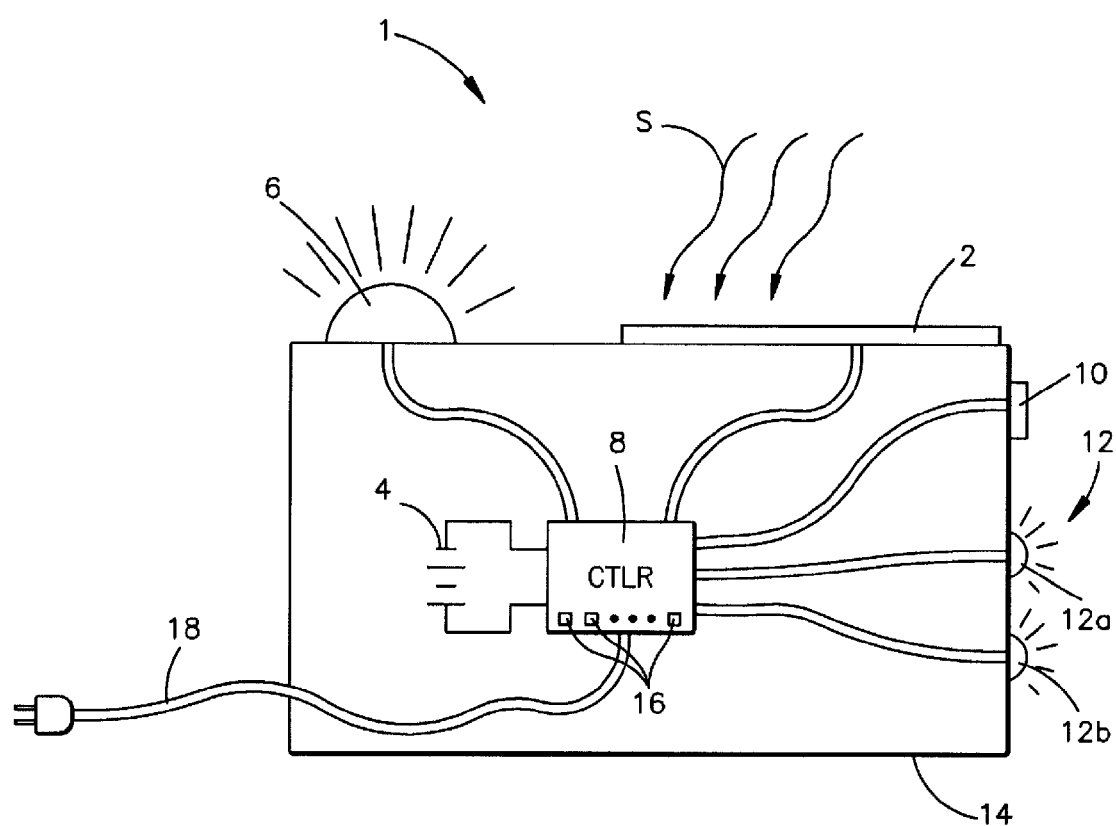
Figure

LAMP WITH METERING DEVICE

TECHNICAL FIELD

The application relates to lamps and a method of collecting carbon offsets.

BACKGROUND

Kerosene lamps are widely used to provide light in homes, especially in poorer areas of third world countries. Kerosene lamps are problematic. They produce harmful fumes. They are also inefficient in terms of light produced relative to the amount of fuel used. They are also higher polluting, in terms of light produced per ton of carbon emission, than an equally illuminating electrical lamp powered by a power station. This is true even when taking into account the carbon emissions at the power station that would be attributable to the electrical lamp.

A "carbon offset" is a financial instrument representing a reduction in greenhouse gas emissions. Carbon offsets are measured in metric tons of carbon dioxide-equivalent. One carbon offset represents a reduction of one ton of carbon dioxide or its equivalent in other greenhouse gases. Companies and governments can buy carbon offsets to comply with caps on total carbon dioxide they are allowed to emit. Also, individuals and companies can purchase carbon offsets to mitigate their own greenhouse gas emissions.

Offsets are typically generated from emissions-reducing projects, most commonly renewable energy projects such as with wind and solar energy. Purchase and withdrawal of emissions trading credits also occurs, which creates a connection between the voluntary and regulated carbon markets.

Carbon offsetting as part of a "carbon neutral" lifestyle has gained appeal and momentum. The Kyoto Protocol has sanctioned offsets as a way for governments and companies to earn carbon credits which can be traded on a marketplace. The protocol established the Clean Development Mechanism (CDM), which validates and measures projects to ensure they produce authentic benefits and are genuinely "additional" activities that would not otherwise have been undertaken. Organizations that have difficulty meeting their emissions quota are able to offset by buying CDM-approved Certified Emissions Reductions.

The commercial system has contributed to the increasing popularity of voluntary offsets among individuals, companies, and organizations. Offsets may be cheaper or more convenient alternatives to reducing one's own fossil-fuel consumption.

The CDM identifies over 200 types of projects suitable for generating carbon offsets, which are grouped into broad categories. The most common are renewable energy, methane abatement, energy efficiency, and fuel switching. Renewable energy offsets commonly include wind, solar and hydroelectric power. Some of these offsets are used to reduce the cost differential between renewable and conventional energy production, increasing the commercial viability of a choice to use renewable energy sources.

Renewable Energy Credits (RECs) are also sometimes treated as carbon offsets, although the concepts are distinct. Whereas a carbon offset represents a reduction in greenhouse gas emissions, a REC represents a quantity of energy produced from renewable sources. To convert RECs into offsets, the clean energy must be translated into carbon reductions, typically by assuming that the clean energy is displacing an equivalent amount of conventionally produced electricity from the local grid. This is known as an indirect offset, because the reduction doesn't take place at the project site itself, but rather at an external site. Once it has been accredited by the United Nations Framework Convention on Climate Change (UNFCCC), a carbon offset project can be used as carbon credit and linked with official emission trading schemes.

Due to their indirect nature, many types of offset are difficult to verify. Some providers obtain independent certification that their offsets are accurately measured, to distance themselves from potentially fraudulent competitors.

SUMMARY

A lamp includes a generator that generates electricity. A battery stores the generated electricity. A light source produces light from the stored electricity. A metering device tallies an operating parameter indicative of the amount of electrical energy consumed by the lamp.

Preferably: The generator produces electricity from solar power or wind power. The light produced by the light source is sufficient to illuminate a room. The metering device is configured to output the parameter in a binary format, using flashes of two different illumination colors as two states of the binary format. The metering device is configured to output the parameter in response to a switch being activated or the lamp being turned on and/or turned off. The metering device tallies the parameter by repeatedly incrementing an accumulator. The metering device tallies accumulcated electrical energy by measuring the actual wattage used. Or tallies the amount of time the light source produced light.

BRIEF DESCRIPTION OF THE DRAWING

The sole FIGURE is a schematic view of a lamp.

DETAILED DESCRIPTION

The drawing and following description provide examples of the elements recited in the claims. These examples enable a person of ordinary skill in the art to make and use the invention, including best mode, without implying limitations not recited in the claims.

As shown in the FIGURE, a lamp 1 includes an electricity generator 2, a storage device 4 for storing the generated electricity, and an electrical appliance. In this example, the appliance is a light source 6 for producing light that can be used to illuminate a room and objects in the room. An electrical controller 8 controls operation of the lamp 1 and monitors and records operational parameters of the lamp 1. The controller 8 receives control input from a user through a user input device 10. The controller 8 communicates the operational parameters it has recorded through an output device 12.

All of the above components 2, 4, 6, 8, 10 and 12 are supported by a common housing 14. The storage device 4 and the controller 8 are contained in the housing 14. The lamp 1 is manually portable in that it can be carried by a user. The lamp 1 can be manually brought outside a home to be exposed to sunlight, and later manually brought inside the home to illuminate a room.

In this particular example: The generator 2 is non-combustion-based, such as a solar panel that is powered by sunlight S, or a water or wind turbine generator. The storage device 4 is a rechargeable battery which can include any number of separate cells. The light source 6 is a white-light super-bright LED. The controller 8 is a PIC controller. The user input device 10 is a momentary pushbutton switch. The communication device 12 is a visual display comprising a set of two indicator lights 12a, 12b, such as a green LED and a red LED.

The controller 8 can adjust the brightness setting of the light source 6. In this example, there are four brightness settings, designated A-D for very low, low, medium and high, in addition to a "light off" setting. The lamp 1 can change to a different setting each time the button 10 is pressed, in a sequence that could be: off, A, B, C, D, off. In another example, the button 10 is replaced by a rotary switch with five positions designated A, B, C, D and off.

The nominal electrical wattage—$NW_A$, $NW_B$, $NW_C$ and $NW_D$—consumed by the light source for settings A-D are successively greater from A to D. These values are pre-determined at the factory. In this example, $NW_A$, $NW_B$, $NW_C$ and $NW_D$ are 0.2, 0.4, 0.8 and 1.6 watts, respectively.

The controller 8 tallies the amount of time—$T_A$, $T_B$, $T_C$ and $T_D$—the lamp has operated at each setting A-D. The time values could be tallied in units of hours in respective accumulators 16. Each accumulator 16 is typically a designated memory location that the controller 8 increments each time another time unit (e.g., hour) has passed. The controller 8 can add the individual hour values together ($T_A+T_B+T_C+T_D$) to determine the total number of hours $T_{TOT}$ the light source 6 has been on.

The controller 8 can calculate the energy consumed by the light source 6, for each setting A-D, by multiplying the amount of time used at that setting by the setting's nominal wattage. For example, the controller 8 can calculate the electrical energy $E_A$ (e.g., watt-hours) consumed when operating at setting A by multiplying $T_A \times NW_A$. The controller 8 can add the energy values together ($E_A+E_B+E_C+E_D$) to obtain the total consumed energy $E_{TOT}$. Therefore, in this example, $E_{TOT}$ equals ($T_A \times 0.2$ watts)+($T_B \times 0.4$ watts)+($T_C \times 0.8$ watts)+($T_D \times 1.6$ watts).

The controller 8 can thus determine, for each setting individually and all settings in total, the hours operated and the energy consumed. The controller 8 can communicate any of these parameters through the output device 12 as lamp-usage data.

An agent can be appointed to visit and enter homes in a designated geographic area that have such lamps 1, to record the lamp-usage data. The agent can record the data that has been tallied by the controller 8 over the course of a predetermined data-collecting time period. This time period can be, for example, the time between each visit by the agent and can typically extend for six months to a year or more. The agent can record the usage data of all such lamps 1 within a predetermined geographic area, or of only a predetermined subset of the lamps 1 to serve as a representative sample of the set of all the lamps 1. Or, each lamp 1 can be brought by its user to the agent.

The lamp 1 can labeled with a marking that identifies the lamp 1, such as the lamp's serial number, which can be recorded by the agent. The marking can be printed on the lamp or its circuit board or affixed via a non-removable sticker. This enables the agent to keep track of the lamp 1 and ensure that the data is being tracked accurately.

The parameters recorded by the agent, indicating energy usage of the lamps 1, can be used for calculating carbon offsets. That is because each watt-hr consumed by this lamp 1 to produce light takes the place of a determinable amount of carbon that would have been emitted if a kerosene lamp, instead, had been used to produce the same amount of light.

The correlation between watt-hours used by this lamp 1 and carbon offsets can be determined in a variety of ways, and the exact method for calculating offsets will be determined upon accreditation of a methodology by an independent third party. One example of how carbon offsets can be determined using the watt-hr information is the following: First, this lamp's light source 6 is turned on at a given wattage to produce a given illumination for a given number of hours, yielding a watt-hr value. Then, a kerosene lamp is used to produce the same illumination for the same number of hours, and the tons-carbon emitted is measured. Then, tons-carbon/watt-hr is calculated. This equals a conversion factor of #carbon-offsets/watt-hr, since a ton of carbon emissions corresponds to one carbon offset.

The values of each parameter can be displayed to the agent in binary format, with a flash of the red LED indicating "0" and a flash of the green LED indicating "1". The controller 8 could then output an integer number, indicating the tally of hours or the tally of watt-hrs, up to a value of $2^N$ where N is the number of flashes. For example, eight flashes, corresponding to 8-bit binary, could convey any integer number in the range 0-255. Similarly, 16 flashes, corresponding to 16-bit binary, could convey any integer number in the range 0-65,535. The agent could record the flashes with a pencil on paper, such as by recording "R" for a red flash and "G" for a green flash.

For example, the number "28" can be represented in 8-bit binary as 00011100, which would be output as eight flashes of red, red, red, green, green, green, red, red. The agent would see the flashes and record "RRRGGGRR" on paper or on a PDA. The agent would be disinclined to try to fudge the data, since the agent typically would not understand the correlation between the sequence of light flashes and the number they represent. Each parameter is thus output in a binary format using the two illumination colors (green and red) as two states (1 and 0) of the binary format. Alternatively, a single indicator light, capable of illuminating two different colors can be used. The controller 8 and the communication device 12 together function as a metering device that tallies usage parameters of the lamp (hours or watt-hrs) and communicates those parameters to the agent. The lamp 1 thus provides credibility in certifying the number of carbon offsets being claimed.

In another example, the agent would have an electronic meter reader that would read the display 12 by sensing each red and green flash and would record the usage data for later upload to a computer for confirming offset credits. The meter reader might also automatically read the lamp's serial number, which could be in the form of a bar code.

Alternatively, the value could be conveyed by only one indicator light which would output a sequence of flashes based on some code. The indicator light could be the primary light source 6 itself. If being read by the electronic meter reader, the sequence of flashes could occur faster than a human can perceive.

In another example, more than two differently colored indicator lights can be used to output the hours or watt-hrs. If only one indicator light flashes at a time, they would provide a base-L number, where L is the number of indicator lights, to yield any integer up to $L^N$, where N is the number of flashes. If any combination of indicator lights could flash simultaneously, a higher maximum integer could be obtained from fewer flashes.

In another example, in place of the colored indicator lights 12a, 12b, the controller 8 might output the usage data through a digital display, such as a 7-segment numerical display configured to output any of ten digits.

In another example, the controller 8 measures the actual wattage—$AW_A$, $AW_B$, $AW_C$ and $AW_D$—as the lamp is being used. The controller 8 can then use these measured wattage values by multiplying by time ($T_A$, etc.) to determine energy used. Or the accumulated watt-hrs could be calculated as a summation or integration of continuously-measured wattage over time. These methods of using measured actual wattage ($AW_A$, etc.) provides a more accurate energy result than using the nominal wattage values ($NW_A$, etc.).

The agent could initiate the data output by pressing the button of the lamp for a specified time duration, such as for eight seconds. Or, the data could be output automatically when the lamp is turned on and/or when the lamp is turned off. Or, the lamp could have a separate button designated to be pressed to initiate the data output.

The controller 8 can reset the accumulator 16 for each parameter that it keeps track of (such as $T_A$, $T_B$, $T_{TOT}$, $E_A$, $E_B$, or $E_{TOT}$) to zero when it displays the usage data to the agent. Alternatively, the accumulators 16 might never be manually reset by the agent but instead returned to zero automatically only after exceeding the maximum number, such when exceeding 255 if the accumulator 16 is in 8-bit binary format. Accordingly, the accumulator 16 repeatedly cycles through each number in its operational range. This discourages the agent from fudging the data, since he would typically not know what the previously-recorded value was for this parameter, and so could not know the relationship between the currently-recorded value and the electrical energy used.

In addition to, or in place of, the solar panel 2, the lamp 1 could have a power cord 18 that inputs electricity from a wall socket connected to a power grid of a public power station. The station could generate the electricity from fuel, including carbon-based fuel such as coal and oil. In this case, a certain amount of carbon emissions from the power station could be attributed to the power consumed by the lamp 1. But even taking this power station carbon emission into account, this present lamp 1 is environmentally cleaner than a kerosene lamp. That is because less carbon is emitted by the power station for powering this lamp 1 to produce light than is emitted by a kerosene lamp to produce the same amount of light. When the lamp 1 is powered through the power grid 1, the conversion factor of #carbon-offsets/watt-hr would be less than if the lamp 1 is powered by the solar panel 2. Therefore, the controller 8 might have additional accumulators 16, to tally usage of solar-produced electricity separately from usage of grid-produced electricity.

The controller 8 might also monitor and display other parameters. These can include:

1) the number of times the battery 4 was recharged over a given period, such as over the aforementioned data collecting time period.
2) the amount of charge (e.g., watt-hrs) last required to charge the battery 4 from one predetermined level to another predetermined level, which indicates the battery's condition. Each "level" could be voltage level.
3) the amount of charge (e.g., watt-hrs) last required to discharge the battery 4 from one predetermined level to another predetermined level, which indicates the battery's condition.
4) charge time, which can be the number of hours the battery 4 was last charged.
5) charge rate of the battery 4, in current or wattage.
6) battery condition, such as whether the battery 4 is weak and should be replaced.
7) tamper status, such as whether the lamp's housing 14 has been opened, which might void the lamp's warrantee or void the offset credit for this lamp.

For items 1-4 above, the processor 8 would tally the respective parameter in an accumulator 16. For item 5 above, the processor would output, preferably in real time, an indication of the rate that the solar panels are charging the battery 4. This would guide the user in orienting the solar panel 2 relative to the sun (or water or wind turbine relative to fluid flow) to optimize the charging rate. The display 12 might flash at a rate that is positively related to the charging rate.

In the above example, the generator 2 is a solar panel, which is non-combustion-based. However, in other examples, the generator 2 can be another non-combustion-based generator, such as a water turbine generator or a wind turbine generator or a hand-crank generator. Or, the generator 2 can be combustion-based, such as a gas-powered or diesel-powered generator or a fuel cell.

In the above example, the electrical appliance is a light source 6 for producing light. However, other electrical appliances are possible, such as a radio, a mobile phone, a charger for charging a mobile phone, and a fan.

The scope of the invention is defined by the claims, and may include other examples that occur to those skilled in the art. Such other examples are intended to be within the scope of the claims if they have elements that do not differ from the literal language of the claims, or if they include equivalent structural elements with insubstantial differences from the literal language of the claims.

The invention claimed is:

1. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the metering device is configured to output the parameter in binary format, using flashes of two different illumination colors as two states of the binary format.

2. The lamp of claim 1 wherein the lamp is manually portable.

3. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the metering device is configured to output the parameter in base-L format using flashes of different illumination colors, where L is the number of illumination colors and is greater than two.

4. The lamp of claim 3 wherein the lamp is manually portable.

5. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the metering device is configured to output the parameter by means of flashes from said light source.

6. The lamp of claim 5 further including a switch, and wherein the metering device is configured to output the parameter in response to the switch being activated.

7. The lamp of claim 5 wherein the metering device is configured to output the parameter when the lamp is turned on.

8. The lamp of claim 5 wherein the metering device tallies the parameter by repeatedly incrementing an accumulator.

9. The lamp of claim 8 wherein the accumulator is configured to repeatedly cycle through a range of numbers without being manually reset.

10. The lamp of claim 5 wherein the parameter is accumulated electrical energy, which the metering device tallies by measuring the actual wattage used.

11. The lamp of claim 5 wherein the parameter is the amount of time the light source produced light.

12. The lamp of claim 5 wherein the lamp is manually portable.

13. The lamp of claim 5 wherein the metering device is configured to output the parameter when the lamp is turned off.

14. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the lamp is capable of a light-off setting and two or more brightness settings, and the metering device keeps track of the parameter for each brightness setting individually.

15. The lamp of claim 14 wherein the metering device is configured to output the parameter via a numerical display.

16. The lamp of claim 14 wherein the lamp is manually portable.

17. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the lamp is capable of a light-off setting and two or more brightness settings, and the metering device tallies a single number indicating the amount of electrical energy that the light source used in producing light, the single number being accumulated over the different brightness settings.

18. The lamp of claim 17 wherein the lamp is manually portable.

19. A lamp comprising:
a generator for generating electricity;
a battery configured to store the generated electricity;
a light source configured to produce light from the stored electricity;
a metering device configured to tally a parameter indicative of the amount of electrical energy consumed by the lamp; and
a power cord configured to be connected to a wall socket to charge the battery from the wall socket, and the metering device being configured to tally the parameter individually for electricity generated by the generator and electricity input through the power cord.

20. The lamp of claim 19 wherein the lamp is manually portable.

21. A lamp comprising:
a generator for generating electricity;
a battery configured to store the generated electricity;
a light source configured to produce light from the stored electricity;
a metering device configured to tally a parameter indicative of the amount of electrical energy consumed by the lamp; and
wherein the metering device is configured to tally the number of times the battery was recharged.

22. The lamp of claim 21 wherein the lamp is manually portable.

23. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the metering device is configured to tally the amount of charge used to charge the battery.

24. The lamp of claim 23 wherein the lamp is manually portable.

25. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the metering device is configured to tally the amount of charge used to discharge the battery.

26. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the metering device is configured to tally the number of hours taken to charge the battery.

27. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the metering device is configured to display an indication of the charge rate of the battery in real time.

28. A lamp comprising:
a generator for generating electricity;
a battery configured to store the generated electricity;
a light source configured to produce light from the stored electricity; and
a metering device configured to tally a parameter indicative of the amount of electrical energy consumed by the lamp;
wherein the metering device is configured to display an indication of whether the battery should be replaced.

29. The lamp of claim 28 wherein the lamp is manually portable.

30. A lamp comprising:
a generator for generating electricity;
a battery configured to store the generated electricity;
a light source configured to produce light from the stored electricity;

a metering device configured to tally a parameter indicative of the amount of electrical energy consumed by the lamp; and a housing supporting the generator, the battery, and the light source, and wherein the metering device is configured to display an indication of whether the housing has been opened.

31. A method for use with an apparatus, that comprises a generator for generating electricity, a battery configured to store the generated electricity, an electrical appliance configured to be powered by the stored electricity, and a metering device configured to tally an operating parameter indicative of the amount of electrical energy consumed by the appliance, wherein the parameter is in units of time or electrical energy, the method comprising:

displaying, by the metering device, the operating parameter; and recording, by an agent, the displayed operating parameter to confirm carbon credits.

32. A method comprising:

using different lamps in different homes, by each lamp:

generating electricity by non-combustion means;

using the electricity to produce light;

tallying a parameter indicative of the accumulated electrical energy used by the lamp; and displaying, by each lamp, a value of the parameter;

recording, by an agent, the displayed values from the different lamps; and using the recorded values to confirm carbon credits.

33. The method of claim 32 wherein, for each lamp, the recording step is performed at the home where the lamp was used.

34. The method of claim 32 wherein the recording step for the different lamps in the different homes is performed at a common location.

35. The method of claim 32 wherein the parameter's value is an amount of time that the light source produced light.

36. The method of claim 32 wherein the parameter's value is the accumulated electrical energy that the respective lamp used in producing the light.

* * * * *